(12) United States Patent
Lo et al.

(10) Patent No.: US 10,692,788 B2
(45) Date of Patent: Jun. 23, 2020

(54) DEVICE TO DECREASE FLICKER NOISE IN CONDUCTOR-INSULATOR-SEMICONDUCTOR (CIS) DEVICES

(71) Applicant: Taiwan Semiconductor Manufacturing Co., Ltd., Hsin-Chu (TW)

(72) Inventors: Wen-Shun Lo, Zhudong Township (TW); Ching-Hsien Huang, Hsinchu (TW); Yu-Chi Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/688,018

(22) Filed: Aug. 28, 2017

(65) Prior Publication Data

US 2019/0067138 A1  Feb. 28, 2019

(51) Int. Cl.
*H01L 23/13* (2006.01)
*H01L 21/762* (2006.01)
(Continued)

(52) U.S. Cl.
CPC ............ *H01L 23/13* (2013.01); *H01L 21/762* (2013.01); *H01L 21/76224* (2013.01);
(Continued)

(58) Field of Classification Search
CPC ..... H01L 23/13; H01L 29/41; H01L 21/28114
See application file for complete search history.

(56) References Cited

U.S. PATENT DOCUMENTS 8,716,768 B2  5/2014 Lyu et al.
9,190,536 B1  11/2015 Chan et al.
(Continued)

OTHER PUBLICATIONS

Carmonai,, M, Hubert, L. Lopezi, F. Julieni, J., Ogieri, D. Goguenheim, and L. Beauvisagei Study of gate contact over active area, 2014 29th Symposium on Microelectronics Technology and Devices (SBMicro), Aracaju, 2014, pp. 1-4. (Year: 2014).*
(Continued)

*Primary Examiner* — Lex H Malsawma
*Assistant Examiner* — Laura M Dykes
(74) *Attorney, Agent, or Firm* — Eschweiler & Potashnik, LLC

(57) ABSTRACT

A conductive-insulator-semiconductor (CIS) device with low flicker noise is provided. In some embodiments, the CIS device comprises a semiconductor substrate, a pair of source/drain regions, a selectively-conductive channel, and a gate electrode. The pair of source/drain regions is in the semiconductor substrate, and the source/drain regions are laterally spaced. The selectively-conductive channel is in the semiconductor substrate, and extends laterally in a first direction, from one of the source/drain regions to another one of the source/drain regions. The gate electrode comprises a pair of peripheral segments and a central segment. The peripheral segments extend laterally in parallel in the first direction. The central segment covers the selectively-conductive channel and extends laterally in a second direction transverse to the first direction, from one of the peripheral segments to another one of the peripheral segments. A method for manufacturing the CIS device is also provided.

20 Claims, 20 Drawing Sheets

(51) Int. Cl.
    *H01L 29/423*     (2006.01)
    *H01L 29/66*     (2006.01)
    *H01L 29/78*     (2006.01)
    *H01L 29/06*     (2006.01)

(52) U.S. Cl.
    CPC ...... *H01L 29/0692* (2013.01); *H01L 29/4238* (2013.01); *H01L 29/6659* (2013.01); *H01L 29/7833* (2013.01); *H01L 29/665* (2013.01)

(56) References Cited

U.S. PATENT DOCUMENTS

| | | | |
|---|---|---|---|
| 10,164,033 B2 | 12/2018 | Yeo et al. | |
| 2006/0192258 A1* | 8/2006 | Tsuchiya | H01L 21/28079 257/412 |
| 2009/0224335 A1* | 9/2009 | Chang | H01L 29/4238 257/396 |
| 2010/0315115 A1 | 12/2010 | Lee et al. | |
| 2012/0074498 A1* | 3/2012 | Chuang | H01L 21/76224 257/368 |
| 2013/0154023 A1* | 6/2013 | Yoshida | H01L 21/82347 257/369 |
| 2013/0334614 A1 | 12/2013 | Liaw | |
| 2014/0042506 A1* | 2/2014 | Ramberg | H01L 27/14614 257/292 |
| 2015/0200249 A1* | 7/2015 | Kundu | H01L 27/1211 257/349 |
| 2017/0235795 A1 | 8/2017 | Gilder | |
| 2017/0294356 A1 | 10/2017 | Yeh et al. | |
| 2019/0088780 A1 | 3/2019 | Choi et al. | |

OTHER PUBLICATIONS

U.S. Appl. No. 15/257,291, filed Sep. 6, 2016.
Non-Final Office Action dated Jun. 2, 2017 for U.S. Appl. No. 15/257,291.
U.S. Appl. No. 15/800,474, filed Nov. 1, 2017.
Kwon, et al. "Effects of Shallow Trench Isolation on Low Frequency Noise Characteristics of Source-Follower Transistors in CMOS Image Sensors." Solid-State Electronics 119 (2016) 29-32, published Mar. 1, 2016.
Chan, et al. "STI Effect on Flicker Noise in 0.13-μm RF NMOS." Proceeding of the 36th European IEEE Solid-State Device Research Conference, 2006. ESSDERC 2006. Published Feb. 12, 2007.
Notice of Allowance dated Nov. 3, 2017 for U.S. Appl. No. 15/257,291.
U.S. Appl. No. 16/363,114, filed Mar. 25, 2019.
Non-Final Office Action dated Oct. 24, 2019 in connection with US. Appl. No. 15/800,474.
Notice of Allowance dated Jan. 15, 2020 in connection with U.S. Appl. No. 15/800,474.
Notice of Allowance dated Mar. 9, 2020 in connection with U.S. Appl. No. 16/363,114.

\* cited by examiner

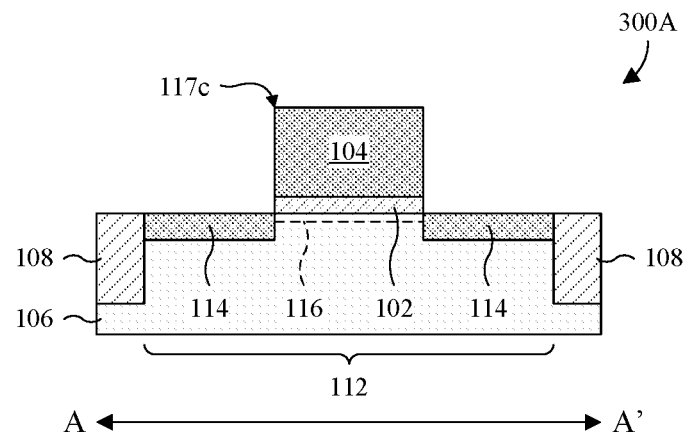
Fig. 3A
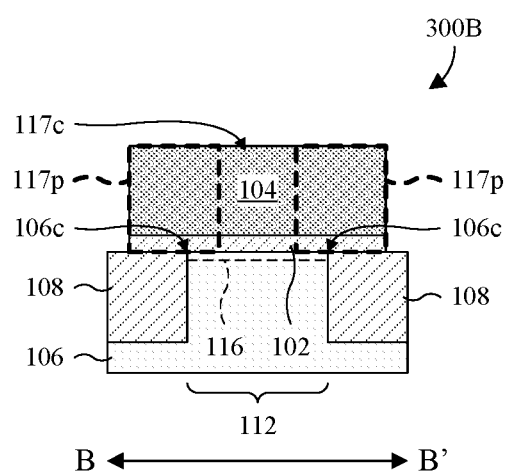 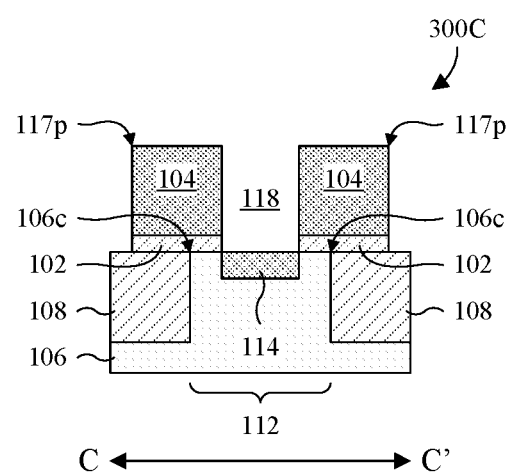
Fig. 3B  Fig. 3C

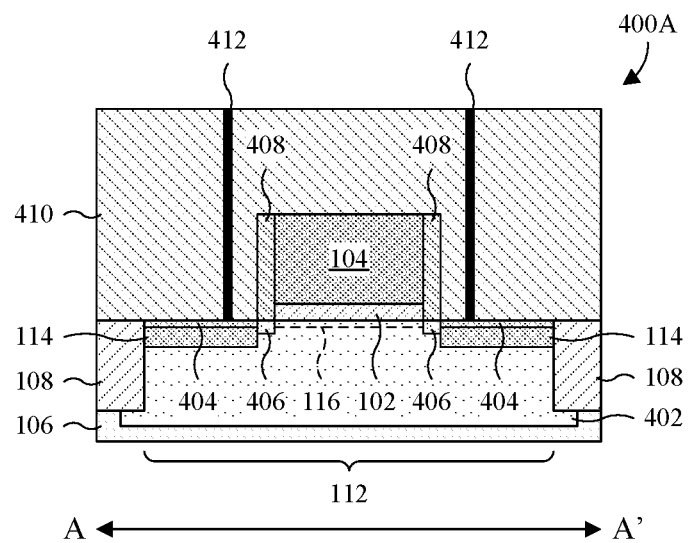
Fig. 4A
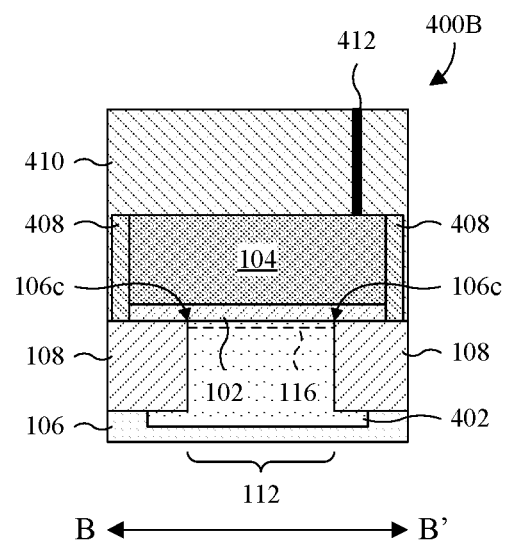 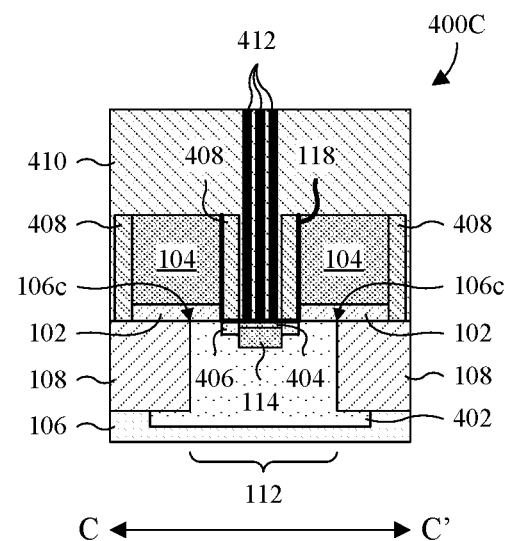
Fig. 4B  Fig. 4C

Fig. 7C                    Fig. 7D

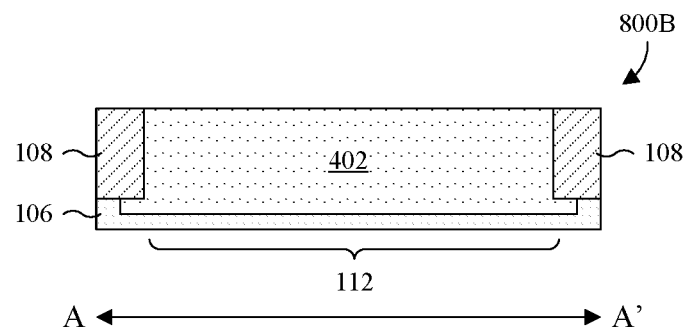
Fig. 8B
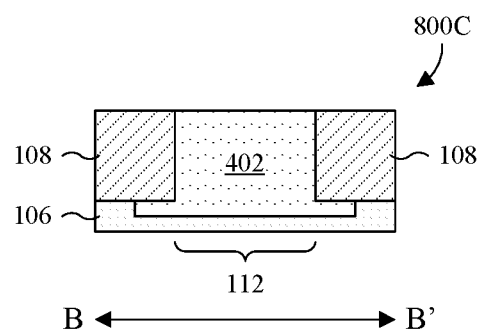 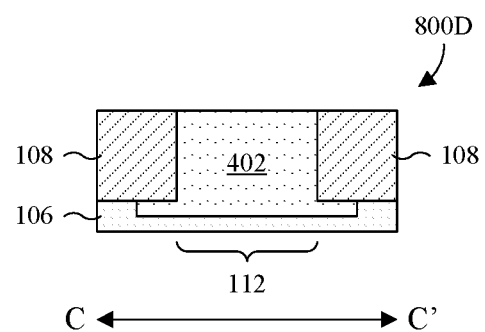
Fig. 8C  Fig. 8D

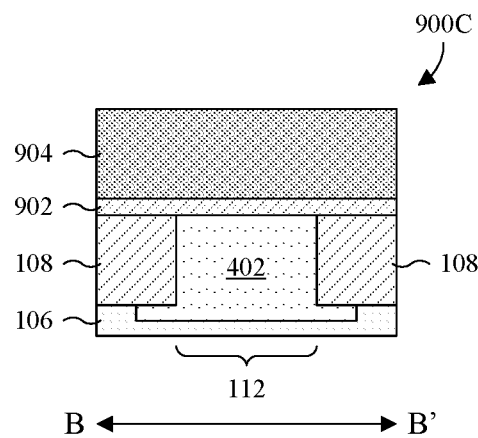
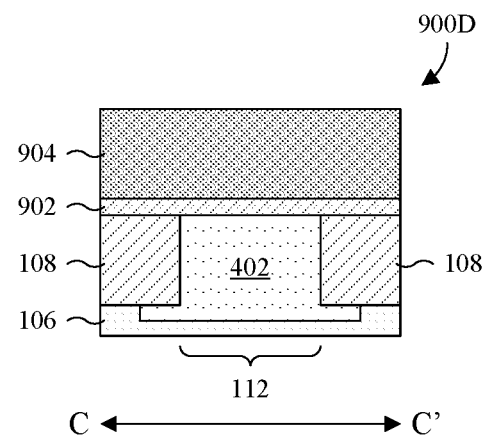
Fig. 9C          Fig. 9D
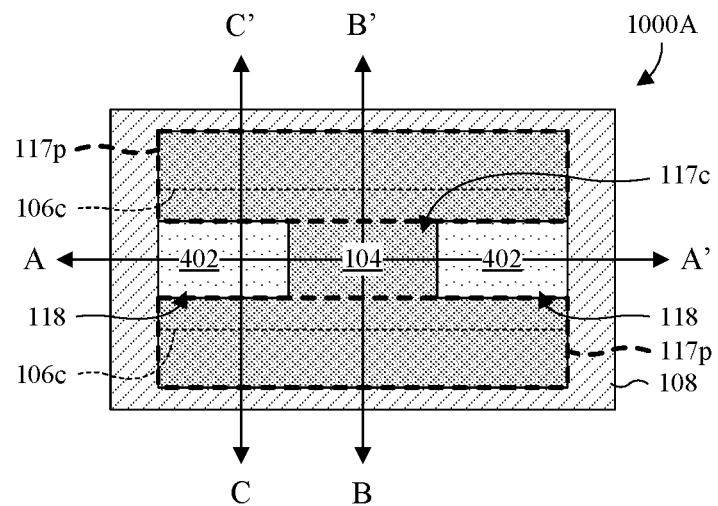
Fig. 10A

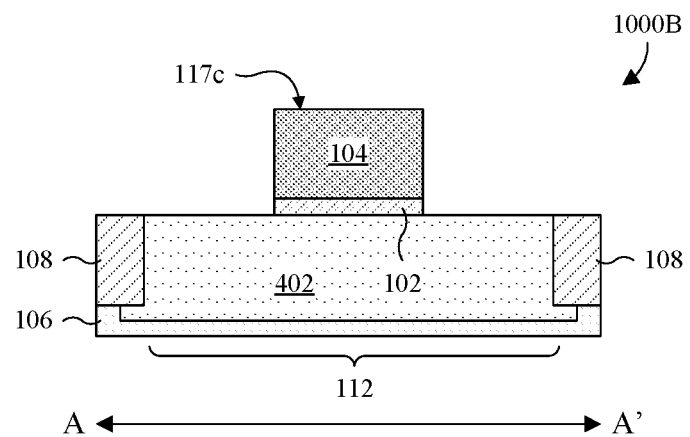
Fig. 10B
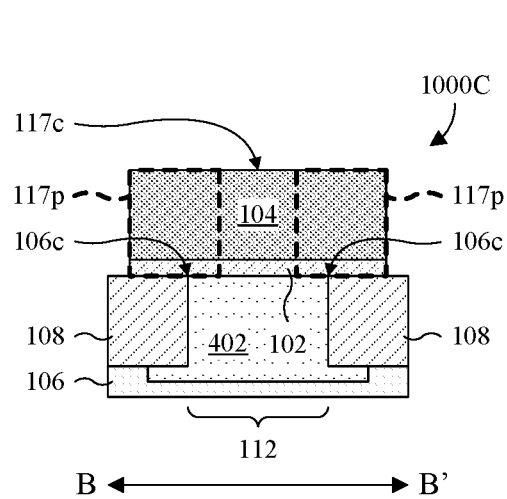 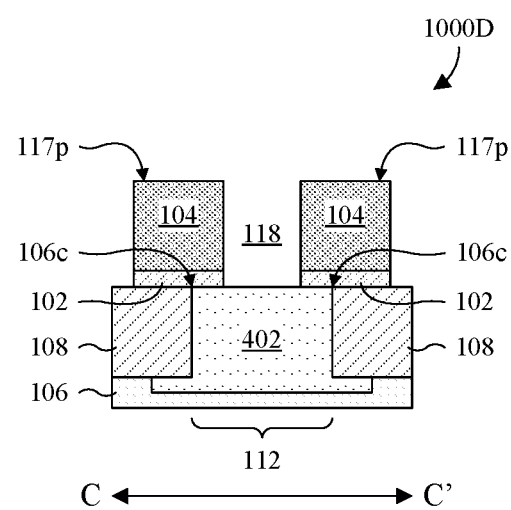
Fig. 10C
Fig. 10D

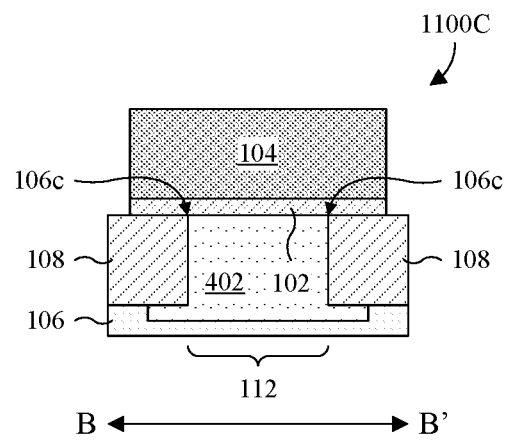
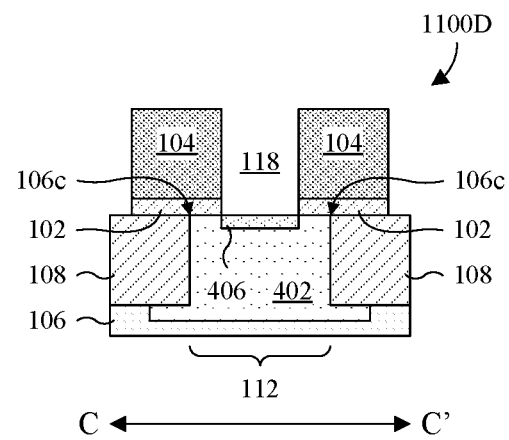
Fig. 11C
Fig. 11D
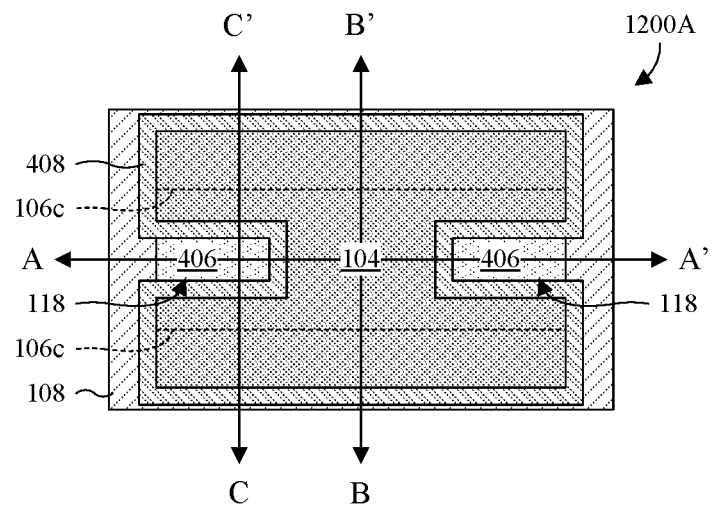
Fig. 12A

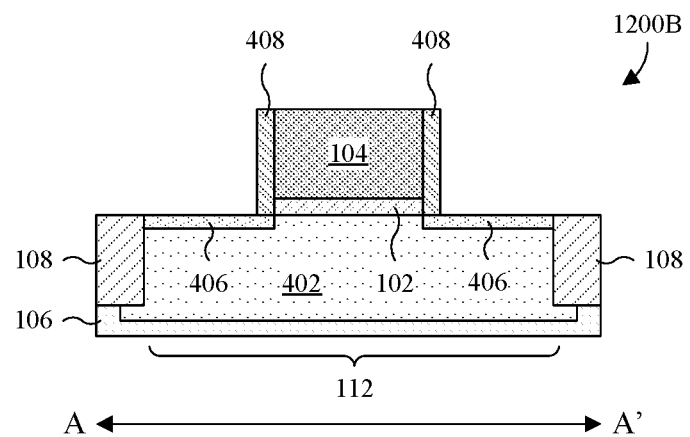
Fig. 12B
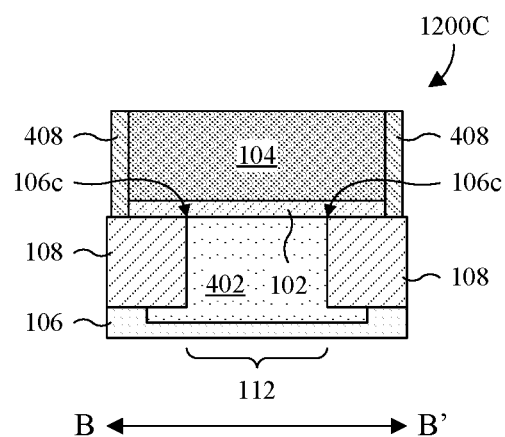 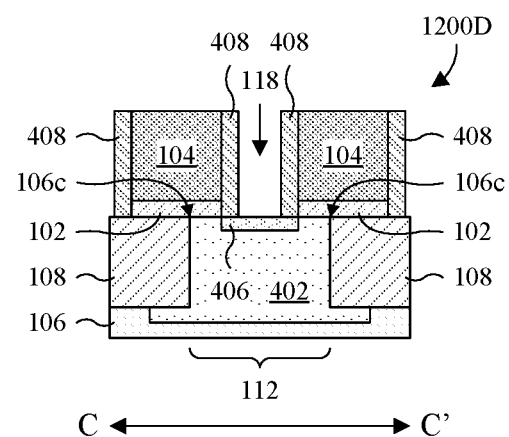
Fig. 12C					Fig. 12D

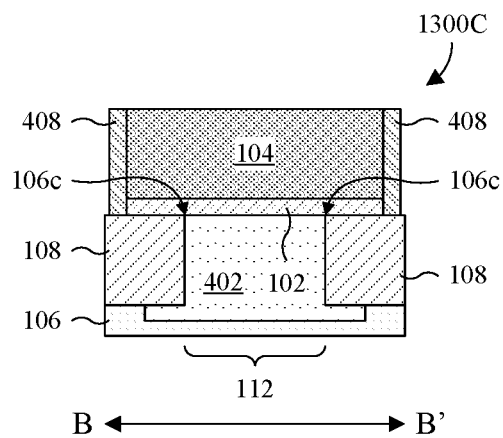
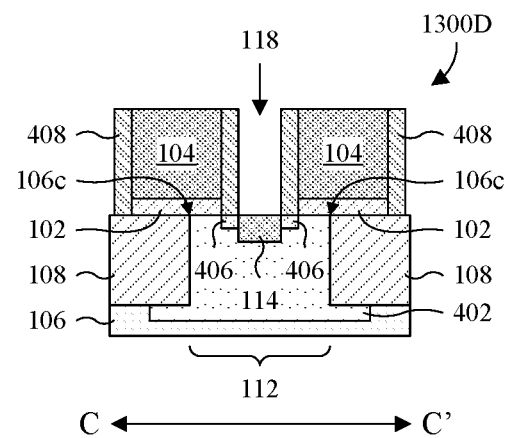
Fig. 13C         Fig. 13D
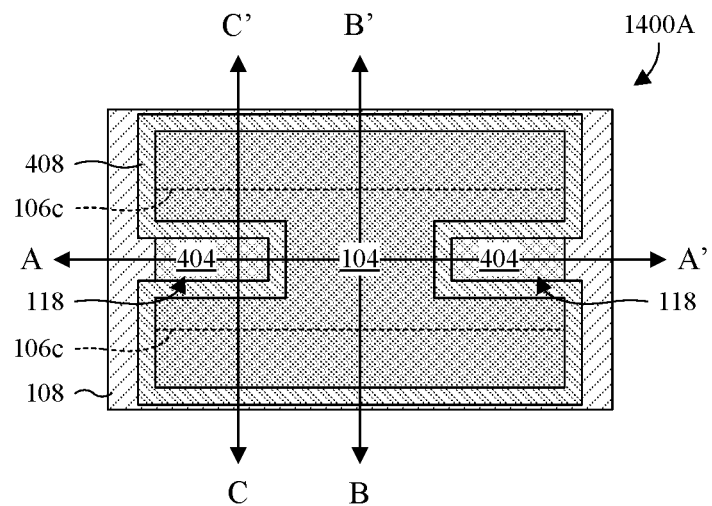
Fig. 14A

DEVICE TO DECREASE FLICKER NOISE IN CONDUCTOR-INSULATOR-SEMICONDUCTOR (CIS) DEVICES

BACKGROUND

Semiconductor devices are electronic components that exploit electronic properties of semiconductor materials to affect electrons or their associated fields. A widely used type of semiconductor device is a conductor-insulator-semiconductor (CIS) device. A CIS device comprises a semiconductor substrate, an insulating layer overlying the semiconductor substrate, and a conductive gate overlying the insulating layer. CIS devices are versatile devices that may be used for, among other things, switches, amplifiers, and memory. Examples of CIS devices include metal-oxide-semiconductor field-effector transistors (MOSFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C illustrate various cross-sectional views of some embodiments of the CIS device of FIG. 2.

FIGS. 4A-4C illustrate various cross-sectional views of some more detailed embodiments of the CIS device of FIG. 2.

FIGS. 7A-7D through 15A-15D illustrate a series of views of some embodiments of a method for manufacturing a CIS device with low flicker noise.

DETAILED DESCRIPTION

Figure 1A:
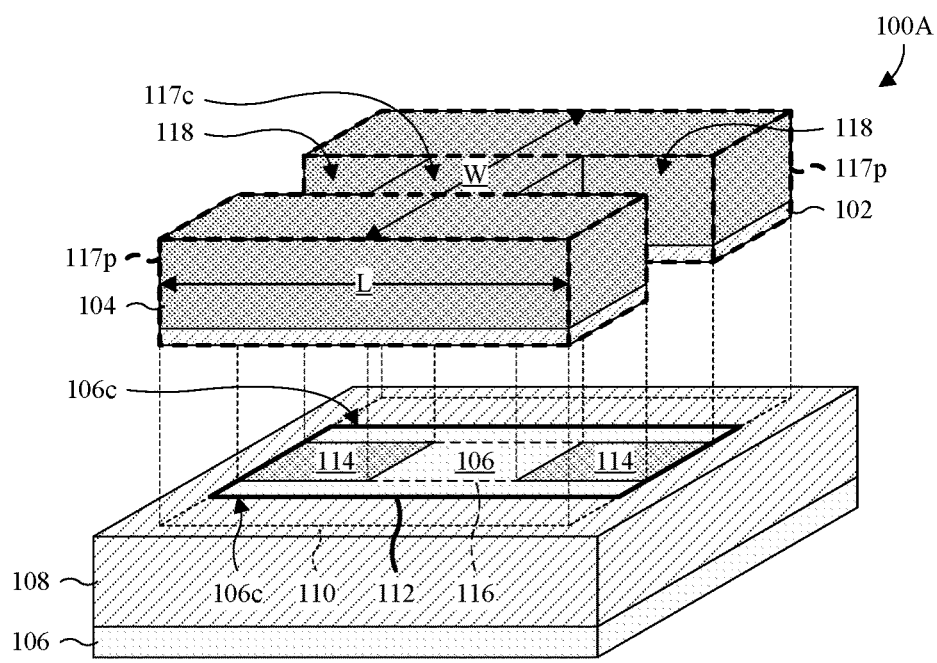
FIGS. 1A-1C illustrate various perspective views of some embodiments of a conductor-insulator-semiconductor (CIS) device with low flicker noise.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some conductor-insulator-semiconductor (CIS) devices comprise a semiconductor substrate and a shallow trench isolation (STI) structure. The STI structure is over and sunken into the semiconductor substrate to demarcate a device region of the semiconductor substrate. Further, the CIS device comprises a pair of source/drain regions, a selectively-conductive channel, a gate dielectric layer, and a gate electrode. The source/drain regions are laterally spaced, and are over and recessed into the device region of the semiconductor substrate. The selectively-conductive channel is in the device region of the semiconductor substrate, laterally between the source/drain regions, and extends laterally from one of the source/drain regions to another one of the source/drain regions. The gate dielectric layer and the gate electrode are between the source/drain regions, and are stacked on the selectively-conductive channel.

A challenge with the above CIS devices is flicker noise. Flicker noise is a type of electronic noise with a 1/f, or "pink", power spectral density. A source of flicker noise is charge carriers trapped and de-trapped by defect states at an interface between the gate dielectric layer and the selectively-conductive channel. Further, a pair of STI corners at the interface contributes to trapping and de-trapping of charge carriers at the interface, such that the STI corners are more specifically a source of flicker noise. The STI corners are top cross-sectional corners of the semiconductor substrate that are on opposite sides of the selectively-conductive channel, that contact the gate dielectric layer, and that border the STI structure in the device region of the semiconductor substrate. Further, the STI corners are line-shaped and each extends laterally along a length of the selectively-conductive channel, from one of the source/drain regions to another one of the source/drain regions.

The STI corners contribute to flicker noise because the STI corners extend respectively from and to the source/drain regions, and are at the interface between the gate dielectric layer and the selectively-conductive channel. Further, the STI corners have a high amount of defect states, and high interactions between charge carriers and the defect states (i.e., the STI corners have high current densities), such that the STI corners define low resistance paths respectively from and to the source/drain regions. The STI corners have a high amount of defect states because the STI corners have high mechanical stress and are not defined by perfectly planar surfaces. The STI corners have high interactions between charge carriers and defect states because the STI corners have high electric fields. The STI corners have high electric fields because the STI corners have small radiuses of curvature.

One approach for mitigating flicker noise is to round the STI corners, thereby lessening electric fields and mechanical stress at the STI corners. Another approach for mitigating flicker noise is to pull back a silicon nitride pad layer used to form the STI structure to move the STI corners from the source/drain regions. For example, a silicon nitride pad layer is formed and patterned on the semiconductor substrate. A first etch is performed into the semiconductor substrate with the silicon nitride pad layer in place to form a trench of the STI structure. Further, a second etch is performed laterally into the silicon nitride pad layer to move the silicon nitride pad layer away from sidewalls of the trench (i.e., to pull back the silicon nitride pad layer). A dielectric layer is formed covering the silicon nitride pad layer and filling the trench, and a planarization is performed into the dielectric layer until a top surface of the dielectric layer is about even with a top surface of the silicon nitride pad layer. The silicon nitride pad layer is removed and a gate stack is formed in place of the silicon nitride pad layer. Because the silicon nitride pad layer is pulled back from the trench by the second etch, the dielectric layer overhangs the semiconductor substrate and covers the STI corners (i.e., top cross-sectional corners of the semiconductor substrate bordering the trench). This, in turn, spaces the STI corners from the gate stack, which reduces flicker noise.

Both approaches to mitigating flicker noise use etching and/or thermal processes that are difficult to integrate into existing process flows. For example, if etching is used for rounding the STI corners and/or pulling back the silicon nitride pad layer, existing structure on the semiconductor substrate may be damaged. Further, if a mask is used to cover the existing structure during the etching, process complexity and costs may be increased.

In view of the foregoing, various embodiments of the present application are directed towards a CIS device that has low flicker noise, and that may be readily integrated into existing process flows. In some embodiments, the CIS device comprises a semiconductor substrate, a pair of source/drain regions, a selectively-conductive channel, and a gate electrode. The source/drain regions are in the semiconductor substrate and are laterally spaced. The selectively-conductive channel is in the semiconductor substrate, and extends laterally in a first direction from one of the source/drain regions to another one of the source/drain regions. The gate electrode comprises a pair of peripheral segments and a central segment. The peripheral segments extend laterally in parallel in the first direction. The central segment covers the selectively-conductive channel and extends laterally in a second direction transverse to the first direction, from one of the peripheral segments to another one of the peripheral segments.

During manufacturing of the CIS device, ion implantation may be performed into the semiconductor substrate with the gate electrode in place so as to form the source/drain regions self-aligned to the gate electrode. The peripheral segments of the gate electrode may mask STI corners of the CIS device so a planar layout of the CIS device has the source/drain regions laterally spaced away from the STI corners in the second direction. As a result of the spacing, the STI corners have high-resistance electrical paths to the source/drain regions and a low amount of current flows along the STI corners. This, in turn, reduces charge carriers becoming trapped and de-trapped by defect states at the STI corners. Accordingly, flicker noise is low. Additionally, flicker noise may be reduced by a low cost, low complexity process because the spacing is a result of the gate layout, and the same photomask used to pattern the gate electrode may also be used to reduce flicker noise.

Figure 1B:
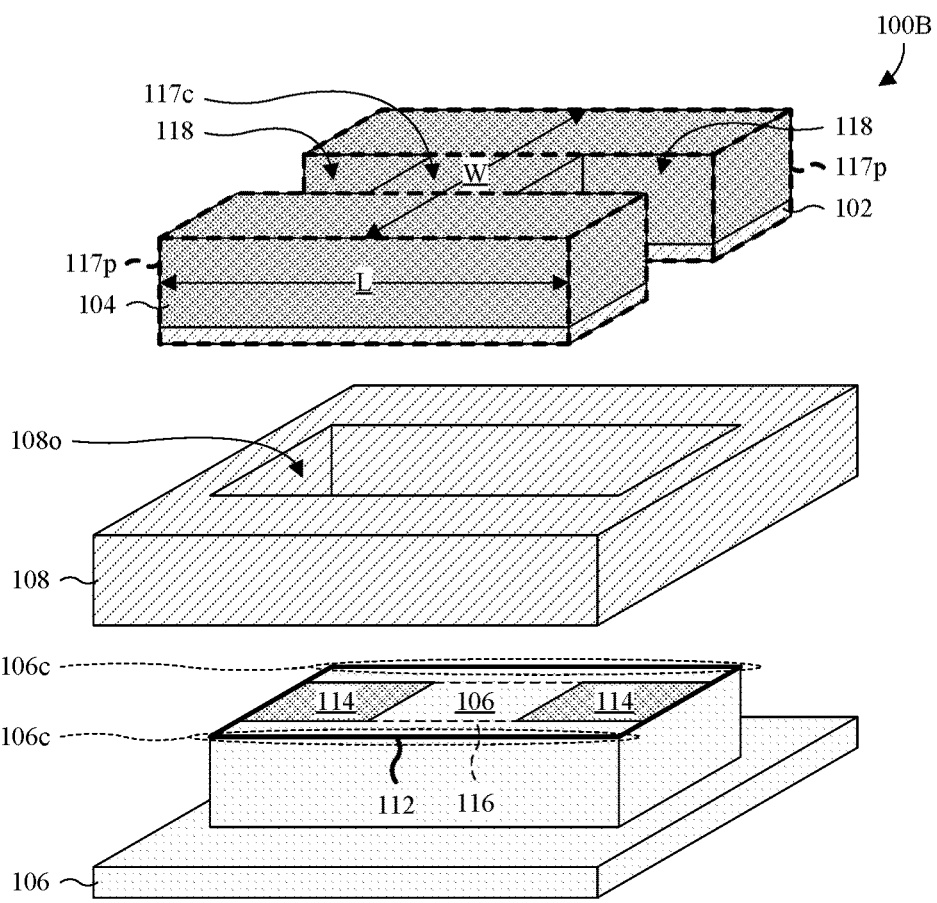
Figure 1C:
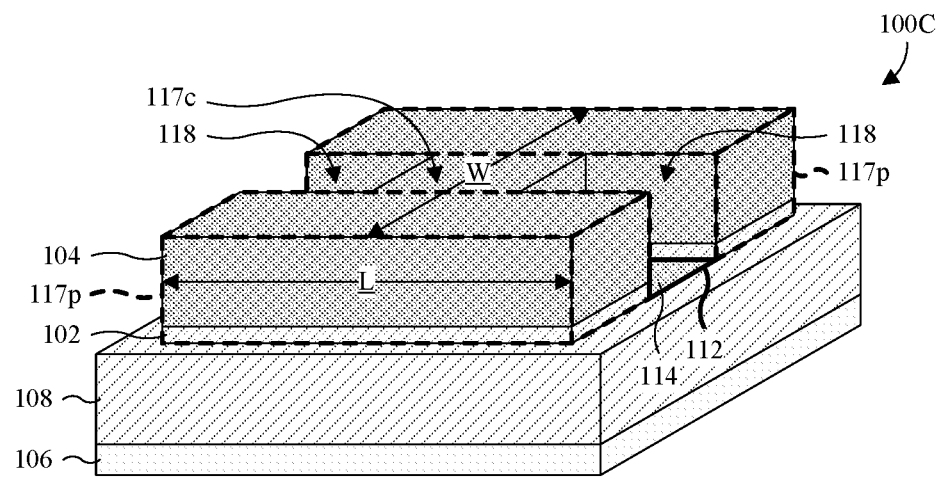

With reference to FIGS. 1A-1C, various perspective views 100A-100C of some embodiments of a CIS device with low flicker noise is provided. FIG. 1A is an exploded perspective view 100A of the CIS device, FIG. 1B is another exploded perspective view 100B of the CIS device, and FIG. 1C is an unexploded perspective view 100C of the CIS device. FIG. 1A is "exploded" in that a gate dielectric layer 102 and a gate electrode 104 are separated from a semiconductor substrate 106 and an isolation structure 108 on which the gate dielectric layer 102 and the gate electrode 104 normally rest. FIG. 1B is "exploded" in the same manner as FIG. 1A, except the isolation structure 108 is further separated from the semiconductor substrate 106 on which the isolation structure 108 normally rests. The CIS device may be, for example, a metal-oxide-semiconductor (MOS) device, such as a MOS field-effector transistor (FET).

As illustrated, the isolation structure 108 is over and extends into the semiconductor substrate 106 to delineate a device region 112 of the semiconductor substrate 106. In some embodiments, the isolation structure 108 has a generally ring-shaped layout, and/or defines a device-region opening 108o (see FIG. 1B) filled by the device region 112. A "generally" ring-shaped layout is similar to a ring-shaped layout, except it is not limited to circular inner and outer sidewalls. For example, a generally ring-shaped layout may be a square ring-shaped layout. The isolation structure 108 may be, for example, a STI region or a deep trench isolation (DTI) region. The semiconductor substrate 106 may be, for example, a bulk semiconductor substrate, such as a bulk silicon substrate of monocrystalline silicon.

A pair of source/drain regions 114 is over and in the device region 112, and the source/drain regions 114 are laterally spaced. Further, the source/drain regions 114 are respectively on a first end of the device region 112 and a second end of the device region 112 opposite the first end. A selectively-conductive channel 116 is in the device region 112, laterally between the source/drain regions 114. Further, the selectively-conductive channel 116 extends from one of the source/drain regions 114 to another one of the source/drain regions 114, along a top surface of the device region 112. In some embodiments, the source/drain regions 114 and the selectively-conductor channel 116 are doped regions of the semiconductor substrate 106 having opposite doping types. For example, the selectively-conductive channel 116 may be p-type and the source/drain regions 114 may be n-type, or vice versa. Further, the source/drain regions 114 are each laterally spaced between a pair of isolation corners 106c.

The isolation corners 106c are top cross sectional corners of the semiconductor substrate 106 that are in the device region 112 and that border the isolation structure 108. Further, the isolation corners 106c are line shaped and extend laterally in parallel with the selectively-conductive channel 116, from the first end of the device region 112 to the second end of the device region 112. In some embodiments, the isolation corners 106c have the same lengths or have substantially the same lengths. Further yet, the isolation corners 106c are on opposite sides of the device region 112, such that the source/drain regions 114 are each directly between the isolation corners 106c. In some embodiments, the isolation corners 106c are each at a location at which a top surface edge of the device region 112 meets a sidewall surface edge of the device region 112, where the sidewall surface of the sidewall surface edge borders and/or adjoins the isolation structure 108. Further, in some embodiments, the isolation corners 106c directly contact the gate dielectric layer 102.

By spacing the source/drain regions 114 from the isolation corners 106c, the CIS device has low flicker noise. Namely, the spacing increases the resistance from the source/drain regions 114 to the isolation corners 106c, such that a low amount of source-drain current flows through the isolation corners 106c. This, in turn, results in low flicker noise. As above, the isolation corners 106c have a high amount of defect states (and hence a high conductivity) because the isolation corners 106c have high mechanical stress and are not defined by perfectly planar surfaces. Further, as above, the isolation corners 106c have small radiuses of curvature that promote high electric field.

The gate dielectric layer 102 and the gate electrode 104 are stacked, such that the gate electrode 104 overlies the gate dielectric layer 102. Further, the gate dielectric layer 102 and the gate electrode 104 overlie the device region 112 of the semiconductor substrate 106, as well as the isolation corners 106c. The gate electrode 104 and, in some embodiments, the gate dielectric layer 102 define a pair of peripheral gate segments 117p and a central gate segment 117c. The peripheral gate segments 117p respectively cover the isolation corners 106c, and extend laterally in parallel with the isolation corners 106c and the selectively-conductive channel 116. The central gate segment 117c covers the selectively-conductive channel 116, and extends laterally respectively from one of the peripheral gate segments 117p to another one of the peripheral gate segments 117p in a direction perpendicular to or substantially perpendicular to the peripheral gate segments 117p.

In some embodiments, the gate dielectric layer 102 and the gate electrode 104 completely cover the isolation corners 106c. Further, in some embodiments, the gate dielectric layer 102 and the gate electrode 104 have the same layout, and/or sidewalls of the gate dielectric layer 102 are aligned to sidewalls of the gate electrode 104. Further yet, in some embodiments, the gate dielectric layer 102 and/or the gate electrode 104 each have an H-shaped layout. Further yet, the gate dielectric layer 102 and/or the gate electrode 104 have a width W that is substantially perpendicular to the isolation corners 106c, and have a length L that is substantially parallel to the isolation corners 106c. The gate dielectric layer 102 may be, for example, silicon dioxide, silicon nitride, a high κ dielectric, some other dielectric, or a combination of the foregoing. As used herein, a high κ dielectric layer is a dielectric with a dielectric constant κ greater than about 3.9, 5, 10, 15, or 20. The gate electrode 104 may be, for example, doped polysilicon, metal, or some other conductive material.

A pair of lateral recesses 118 is defined by the gate electrode 104 and, in some embodiments, the gate dielectric layer 102. The lateral recesses 118 extend vertically through the gate electrode 104, from top to bottom, and extend laterally into sides of the gate electrode 104. The lateral recesses 118 are each laterally spaced between the isolation corners 106c. In some embodiments, the lateral recesses 118 are at a width-wise center of the gate electrode 104 (i.e., at a center of the width W of the gate electrode 104). Further, the lateral recesses 118 are respectively on opposite sides of the gate electrode 104 and respectively overlie the source/drain regions 114. In some embodiments, the lateral recesses 118 are laterally spaced along the length L of the gate electrode 104. Further, in some embodiments, the lateral recesses 118 each have a side that is open, and three sides defined by the gate electrode 104 and, in some embodiments, the gate dielectric layer 102.

By having the lateral recesses 118 in the gate electrode 104, and the peripheral gate segments 117p covering the isolation corners 106c, the gate electrode 104 may be employed as a mask to form the source/drain regions 114 laterally spaced from the isolation corners 106c in a planar layout of the CIS device. This, in turn, allows a low cost, low complexity process for reducing flicker noise since the same photomask used to pattern the gate electrode 104 may also be used to reduce flicker noise.

Figure 2:
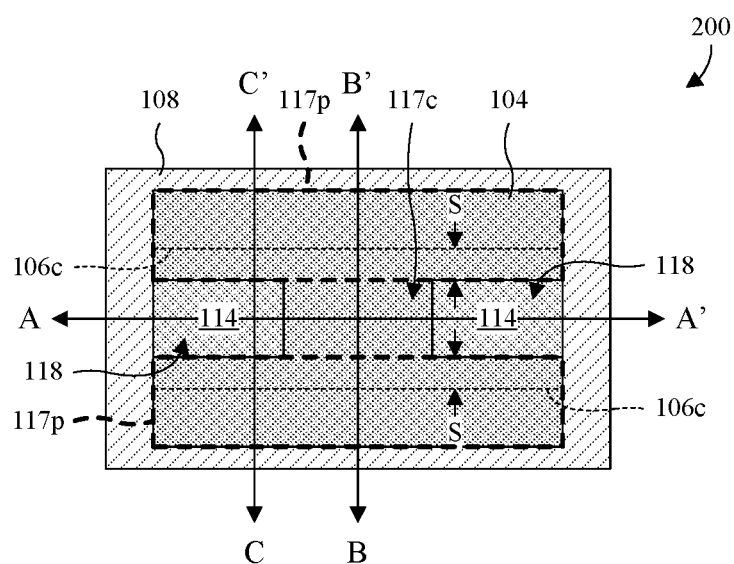
FIG. 2 illustrates a top view of some embodiments of the CIS device of FIGS. 1A-1C.

With reference to FIG. 2, a top view 200 of some embodiments of the CIS device of FIGS. 1A-1C is provided. As illustrated, the gate electrode 104 overlaps the isolation corners 106c (shown in phantom), and is laterally between a pair of source/drain regions 114. Further, the source/drain regions 114 are laterally spaced in a first direction, and are laterally spaced between the isolation corners 106c in a second direction perpendicular to or substantially perpendicular to the first direction. In some embodiments, the source/drain regions 114 are laterally spaced from each of the isolation corners 106c by an amount S and in the second direction. As noted above, the CIS device has low flicker noise due to the spacing between the isolation corners 106c and the source/drain regions 114. Further, in some embodiments, the gate electrode 104 has an H-shaped layout. Further yet, in some embodiments, the gate electrode 104 has a pair of peripheral gate segments 117p and a central gate segment 117c. The peripheral gate segments 117p respectively cover the isolation corners 106c, and the central gate segment 117c bridges the peripheral segments 117p.

With reference to FIGS. 3A-3C, various cross-sectional views 300A-300C of some embodiments of the CIS device of FIG. 2 are provided. FIG. 3A may, for example, be taken along line A-A' in FIG. 2. FIG. 3B may, for example, be taken along line B-B' in FIG. 2. FIG. 3C may, for example, be taken along line C-C' in FIG. 2.

As illustrated by the cross-sectional view 300A of FIG. 3A, the isolation structure 108 is recessed into a top surface of the semiconductor substrate 106 and demarcates the device region 112 of the semiconductor substrate 106. Further, the source/drain regions 114 and the selectively-conductive channel 116 are in the device region 112 of the semiconductor substrate 106, and the selectively-conductive channel 116 extends respectively from one of the source/drain regions 114 and to another one of the source/drain regions 114. Further yet, the gate dielectric layer 102 and the gate electrode 104 are stacked on the device region 112 of the semiconductor substrate 106, between the source/drain regions 114, and define the central gate segment 117c, which covers the selectively-conductive channel 116.

As illustrated by the cross-sectional view 300B of FIG. 3B, the gate electrode 104 overlaps the isolation corners 106c. Further, the gate dielectric layer 102 and the gate electrode 104 extend continuously respectively from and to opposite sides of the device region 112. Further yet, in some embodiments, the selectively-conductive channel 116 extends continuously respectively from and to the opposite sides of the device region 112. The gate dielectric layer 102 and the gate electrode 104 define the peripheral gate segments 117p, which respectively cover the isolation corners 106c. Further, the gate dielectric layer 102 and the gate electrode 104 define the central gate segments 117c, which covers the selectively-conductive channel 116 laterally between the peripheral gate segments 117p.

As illustrated by the cross-sectional view 300C of FIG. 3C, the peripheral gate segments 117p respectively cover the isolation corners 106c and are laterally spaced by one of the lateral recesses 118. Further, one of the source/drain regions 114 is directly under the one of the lateral recesses 118, and is laterally spaced from the isolation corners 106c. The one of the lateral recesses 118 extends vertically through the gate electrode 104 and, in some embodiments, the gate dielectric layer 102.

With reference to FIGS. 4A-4C, various cross-sectional views 400A-400C of some more detailed embodiments of the CIS device of FIG. 2 are provided. FIG. 4A may, for example, be taken along line A-A' in FIG. 2. FIG. 4B may, for example, be taken along line B-B' in FIG. 2. FIG. 4C may, for example, be taken along line C-C' in FIG. 2.

As illustrated by the cross-sectional view 400A of FIG. 4A, in some embodiments, a well 402 is in the device region 112 of the semiconductor substrate 106. Further, in some embodiments, the well 402 underlies the isolation structure 108. The well 402 is a region of the semiconductor substrate 106 with a p-type or n-type doping, which may, for example, be opposite that of the source/drain regions 114.

In some embodiments, the source/drain regions 114 and the selectively-conductive channel 116 are in the well 402. Further, in some embodiments, the source/drain regions 114 are respectively covered by a pair of silicide layers 404, and/or respectively adjoin a pair of lightly-doped drain (LDD) extensions 406 between the source/drain regions 114. The silicide layers 404 may be, for example, nickel silicide. The LDD extensions 406 have the same doping type as the source/drain regions 114 and may be, for example, doped regions of the semiconductor substrate 106 that are lightly doped relative to the source/drain regions 114.

In some embodiments, a spacer 408 lines opposite sidewalls of the gate electrode 104 to space the opposite sidewalls of the gate electrode 104 from the source/drain regions 114. Further, in some embodiments, the spacer 408 further lines opposite sidewalls of the gate dielectric layer 102 to space the opposite sidewalls of the gate dielectric layer 102 from the source/drain regions 114. Further yet, in some embodiments, the spacer 408 overlaps the LDD extensions 406. The spacer 408 may be, for example, silicon dioxide, silicon nitride, some other dielectric, or a combination of the foregoing.

In some embodiments, an interlayer dielectric (ILD) layer 410 covers the gate electrode 104, the spacer 408, the silicide layers 404, the source/drain regions 114, the well 402, the isolation structure 108, the semiconductor substrate 106, or a combination of the foregoing. Further, in some embodiments, contact vias 412 extends through the ILD layer 410, to the source/drains 114 and/or to the silicide layers 404. The ILD layer 410 may be, for example, silicon dioxide, silicon nitride, a low κ dielectric, some other dielectric, or a combination of the foregoing. As used herein, a low κ dielectric is a dielectric with a dielectric constant κ less than about 3.9, 3, 2, or 1. The contact vias 412 may be, for example, tungsten, copper, aluminum copper, aluminum, or some other metal.

As illustrated by the cross-sectional view 400B of FIG. 4B, in some embodiments, the spacer 408 overlaps the isolation structure 108. Further, in some embodiments, the well 402 extends continuously respectively from and to opposite sides of the device region 112 of the semiconductor substrate 106. Further yet, in some embodiments, one of the contact vias 412 extends through the ILD layer 410 to the gate electrode 104.

As illustrated by the cross-sectional view 400C of FIG. 4C, in some embodiments, a plurality of the contact vias 412 (e.g., three of the contact vias 412) extend through one of the lateral recesses 118 to one of the source/drain regions 114. Further, in some embodiments, the spacer 308 is on opposite sidewalls of the gate electrode 104 that are in the one of the lateral recesses 118. Further yet, in some embodiments, the spacer 308 is on opposite sidewalls of the gate dielectric layer 102 that are in the one of the lateral recesses 118.

Figure 5:
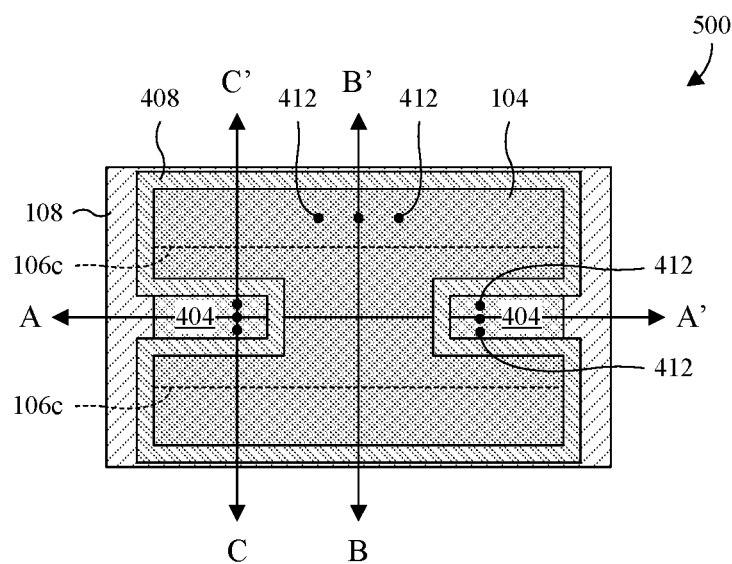
FIG. 5 illustrates a top view of some embodiments of the CIS device of FIGS. 4A-4C.

With reference to FIG. 5, a top view 500 of some more detailed embodiments of the CIS device of FIGS. 4A-4C is provided. For clarity, the ILD layer 410 of FIGS. 4A-4C is omitted. FIG. 4A may, for example, be taken along line A-A' in FIG. 5. FIG. 4B may, for example, be taken along line B-B' in FIG. 5. FIG. 4C may, for example, be taken along line C-C' in FIG. 5.

As illustrated, the spacer 408 extends laterally along sidewalls of the gate electrode 104, while conforming to the gate electrode 104, to completely enclose the gate electrode 104. Further, the pair of silicide layers 404 are laterally spaced by the gate electrode 104 and respectively on opposite sides of the gate electrode 104. Further yet, the contact vias 412 overlie and contact the gate electrode 104 and the silicide layers 404. For ease of illustration, only some of the contact vias 412 are labeled 412.

Figure 6:
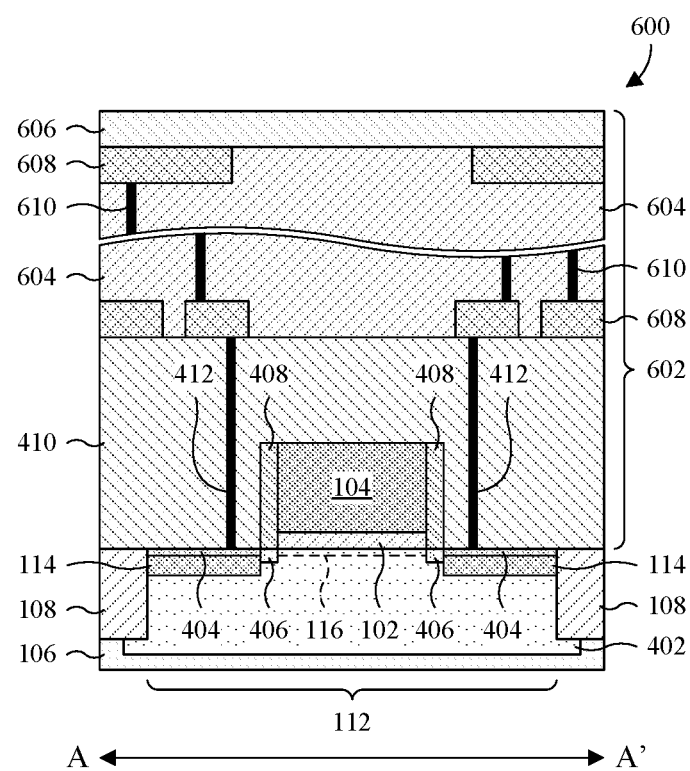
FIG. 6 illustrates a cross-sectional view of some more detailed embodiments of the CIS device of FIGS. 4A-4C.
Figure 7A:
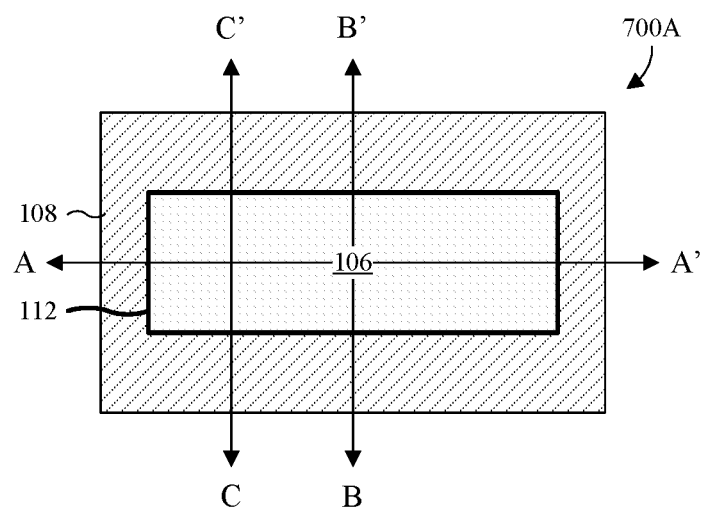
Figure 7B:
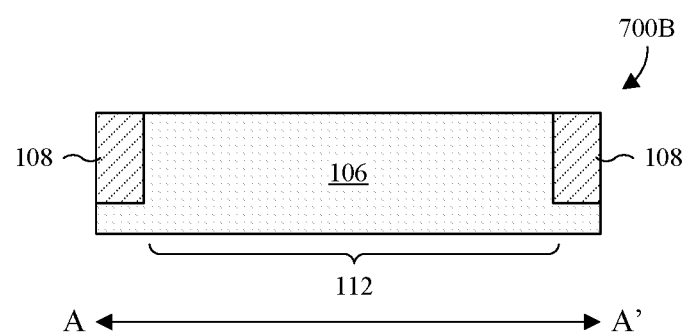

With reference to FIG. 6, a cross-sectional view 600 of some more detailed embodiments of the CIS device of FIGS. 4A-4C is provided. The cross-sectional view 600 may, for example, be taken along line A-A' in FIG. 5.

As illustrated, a back-end-of-line (BEOL) interconnect structure 602 covers the semiconductor substrate 106, the isolation structure 108, the silicide layers 404, the gate electrode 104, and the spacer 408. The BEOL interconnect structure 602 comprises the ILD layer 410, one or more additional ILD layers 604, and a passivation layer 606 stacked upon one another. The additional ILD layer(s) 604 overlie the ILD layer 410, and the passivation layer 606 overlies the additional ILD layer(s) 604. The additional ILD layer(s) 604 and the passivation layer 606 may be, for example, oxide, nitride, a low κ dielectric, some other dielectric, or a combination of the foregoing.

The BEOL interconnect structure 602 further comprises the contact vias 412, as well as a plurality of wires 608 and a plurality of inter-wire vias 610, stacked within the ILD layer 410, the additional ILD layer(s) 604, and the passivation layer 606. For ease of illustration, only some of the wires 608 are labeled 608, and only some of the inter-wire vias 610 are labeled 610. The wires 608 and the inter-wire vias 610 may be, for example, tungsten, copper, aluminum copper, aluminum, some other conductive material, or a combination of the foregoing.

Figure 8A:
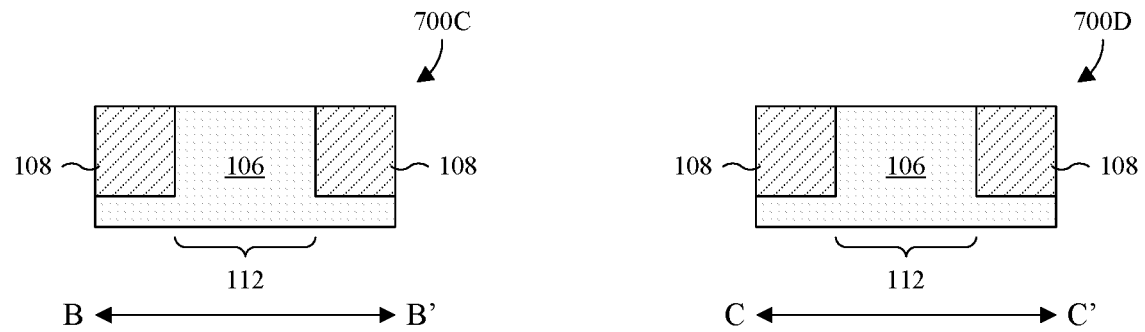
Figure 8A:
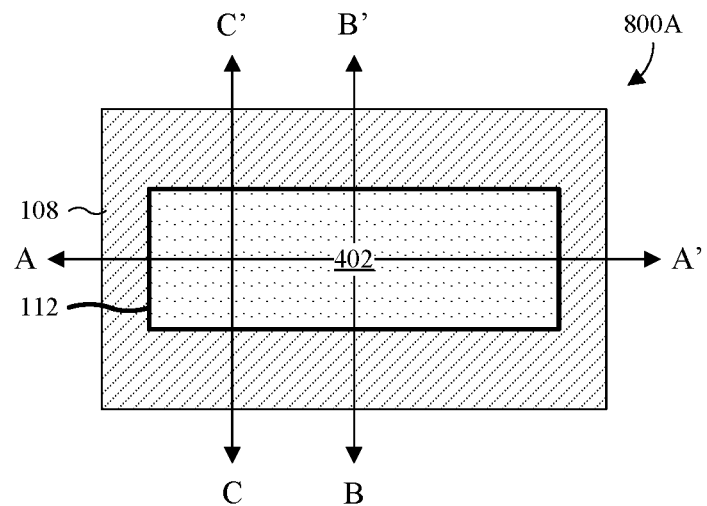
Figure 9A:
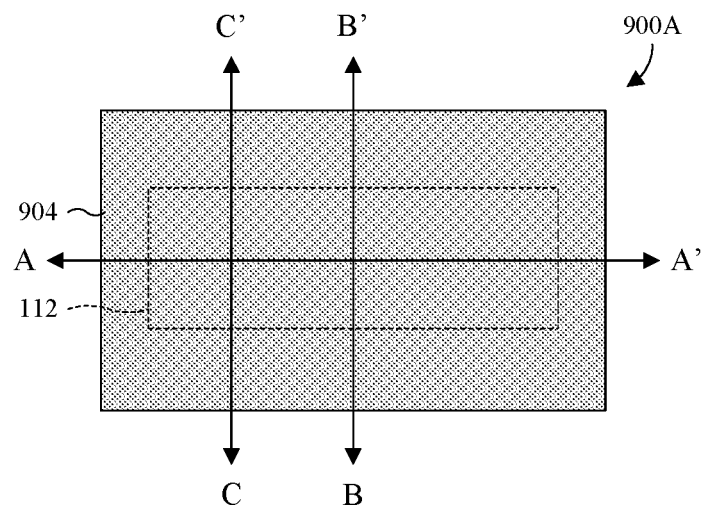
Figure 9B:
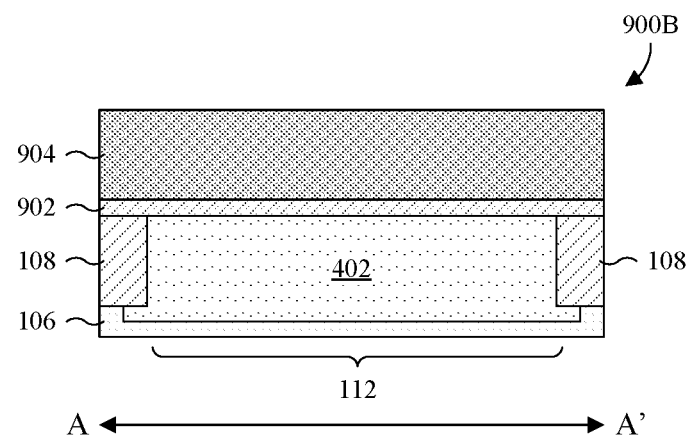
Figure 11A:
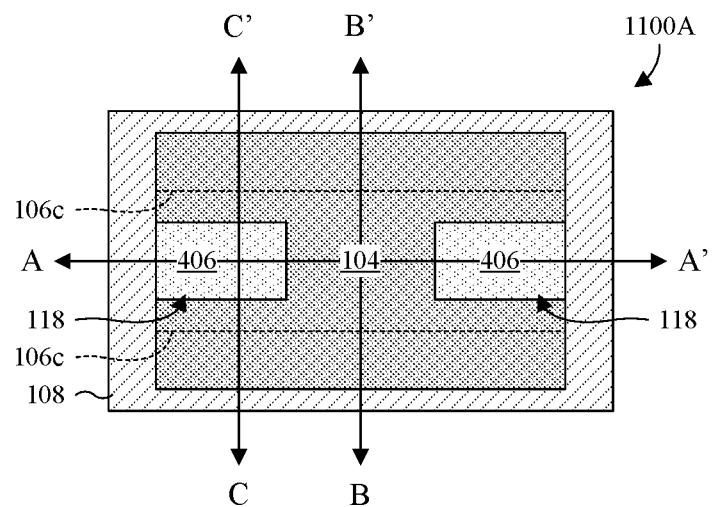
Figure 11B:
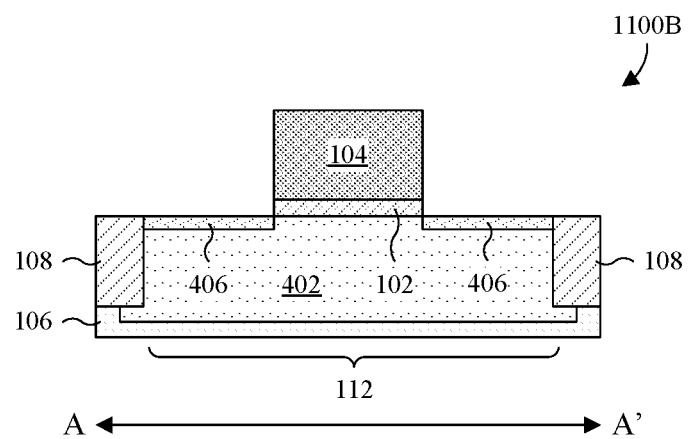
Figure 13A:
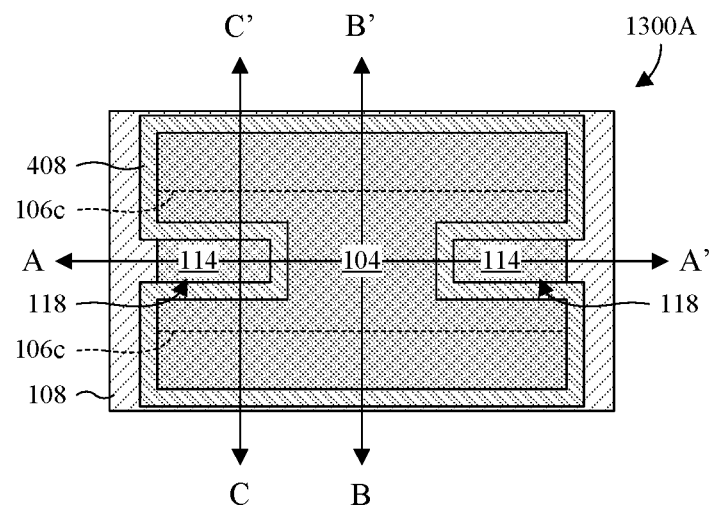
Figure 13B:
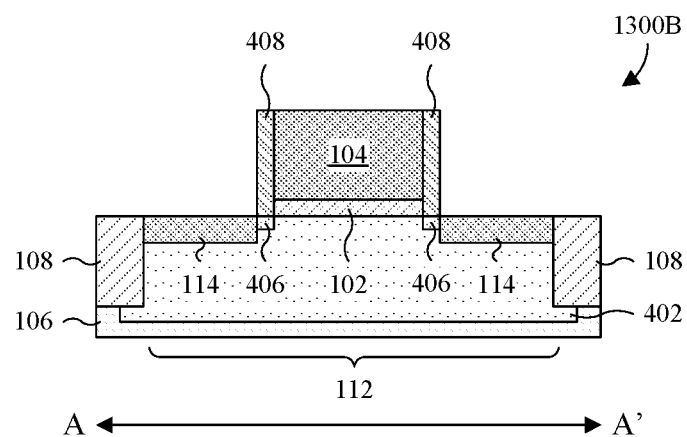
Figure 14B:
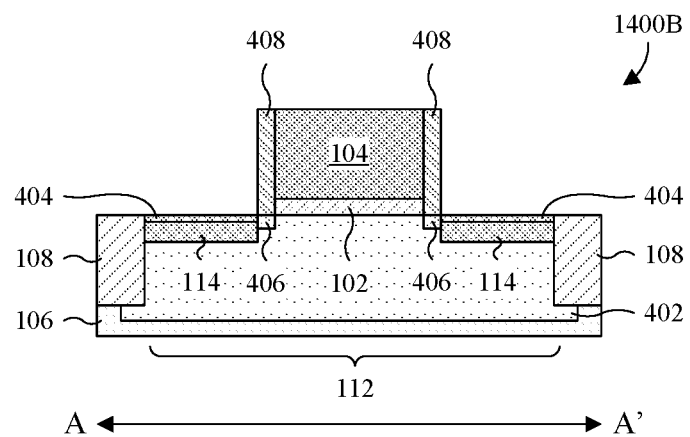
Figure 14C:
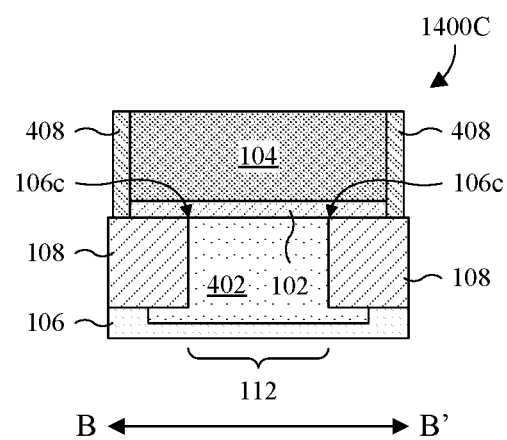
Figure 14D:
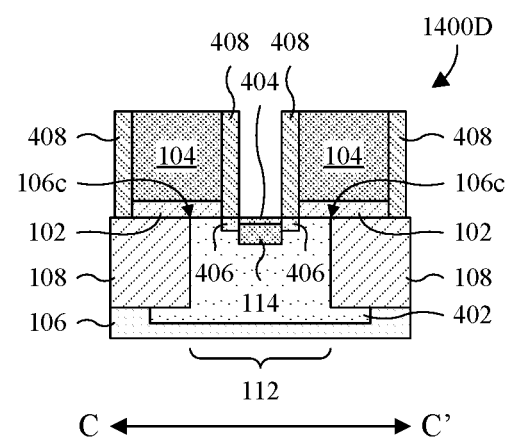
Figure 15A:
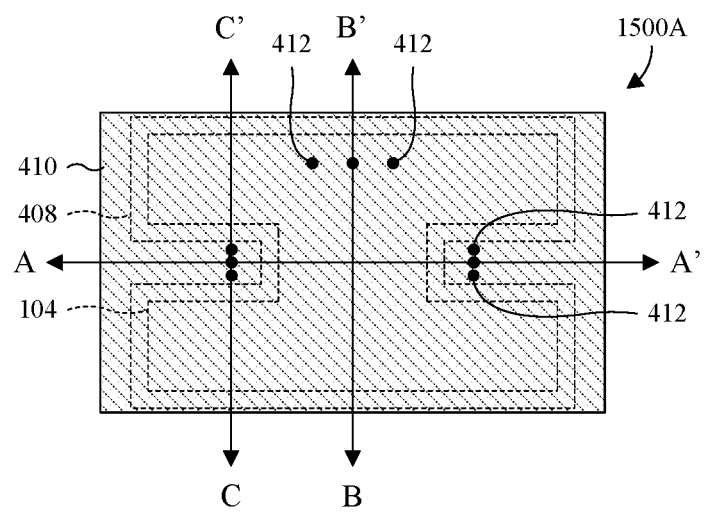
Figure 15B:
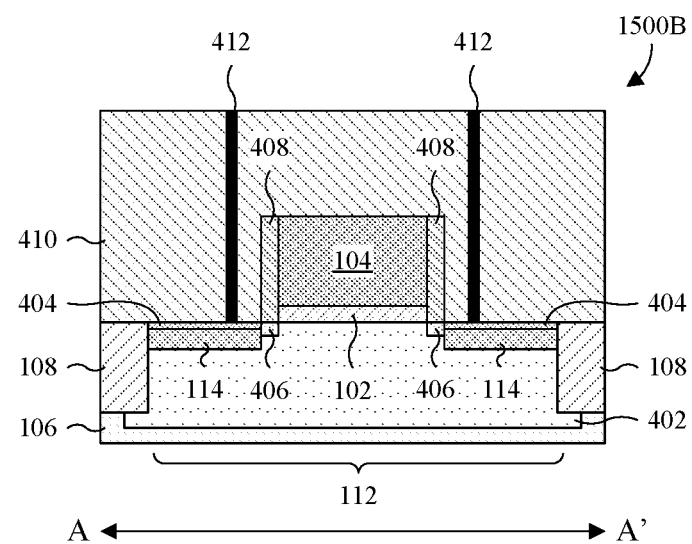
Figure 15C:
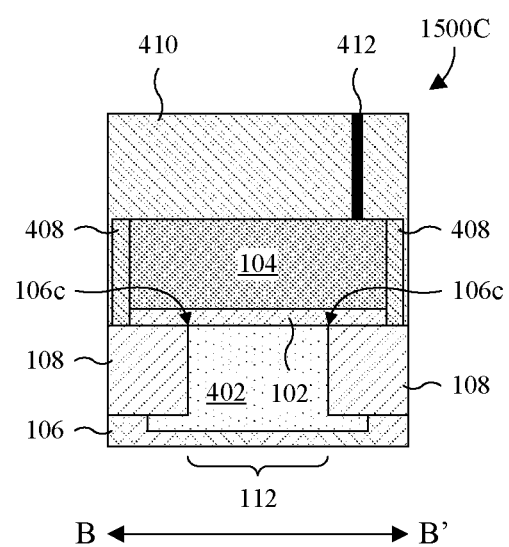
Figure 15D:
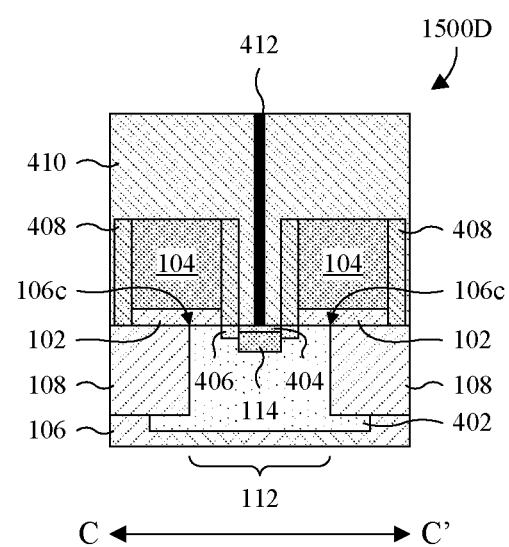

With reference to FIGS. 7A-7D through 15A-15D, a series of views 700A-700D through 1500A-1500D of some embodiments of a method for manufacturing a CIS device with low flicker noise is provided. Figures having a suffix of "A" (e.g., FIG. 7A) are top views of the CIS device under manufacture. Figures having a suffix of "B" (e.g., FIG. 8B) are cross-sectional views of the CIS device under manufacture, taken along line A-A' in the figures having a suffix of "A". Figures having a suffix of "C" (e.g., FIG. 9C) are cross-sectional views of the CIS device under manufacture, taken along line B-B' in the figures having a suffix of "A". Figures having a suffix of "D" (e.g., FIG. 10D) are cross-sectional views of the CIS device under manufacture, taken along line C-C' in the figures having a suffix of "A". The CIS device may, for example, be the CIS device of in FIGS. 4A-4C and/or FIG. 5.

As illustrated by the views 700A-700D of FIGS. 7A-7D, an isolation structure 108 is formed over the semiconductor substrate 106, sunken into a top of the semiconductor substrate 106. Further, the isolation structure 108 is formed demarcating a device region 112 of the semiconductor substrate 106. In some embodiments, the device region 112 of the semiconductor substrate 106 has a square or rectangular layout, and/or the isolation structure 108 has a square or rectangular ring-shaped layout. The isolation structure 108 may be, for example, an STI or DTI region, and/or the semiconductor substrate 106 may be, for example, a bulk substrate of monocrystalline or polycrystalline silicon or some other type of semiconductor substrate.

In some embodiments, a process for forming the isolation structure 108 comprises performing an etch into the semiconductor substrate 106 to form a trench in the semiconductor substrate 106, and subsequently filling the trench with a dielectric material. The trench may, for example, be formed with the desired layout of the isolation structure, and/or the dielectric material may be, for example, silicon dioxide.

As illustrated by the views 800A-800D of FIGS. 8A-8D, in some embodiments, a well 402 is formed in the device region 112 of the semiconductor substrate 106. The well 402 is a region of the semiconductor substrate 106 having an n-type doping or a p-type doping. Further, in some embodiments, the well 402 has a doping type opposite that of adjoining regions of the semiconductor substrate 106, or the adjoining regions of the semiconductor substrate 106 are intrinsic. The well 402 may, for example, be formed by ion implantation.

As illustrated by the views 900A-900D of FIGS. 9A-9D, a dielectric layer 902 and a conductive layer 904 are formed stacked on the isolation structure 108 and the device region 112 of the semiconductor substrate 106, such that the conductive layer 904 overlies the dielectric layer 902. The dielectric layer 902 may, for example, be silicon dioxide, a high κ dielectric, or some other dielectric, and/or the conductive layer 904 may be, for example, metal, doped polysilicon, or some other conductive. In some embodiments, the dielectric layer 902 is a high κ dielectric and the conductive layer 904 is metal.

In some embodiments, a process for forming the dielectric layer 902 and the conductive layer 904 comprises depositing or growing the dielectric layer 902 on the isolation structure 108 and the device region 112 of the semiconductor substrate 106, and subsequently depositing or growing the conductive layer 904 on the dielectric layer 902. The dielectric layer 902 may, for example, be deposited or grown by thermal oxidation, chemical or physical vapor deposition, sputtering, or some other deposition or growth process. The conductive layer 904 may, for example, be deposited or grown by electrochemical plating, chemical or physical vapor deposition, sputtering, some other deposition or growth process.

As illustrated by the views 1000A-1000D of FIGS. 10A-10D, the conductive layer 904 and the dielectric layer 902 are patterned respectively into a gate electrode 104 and a gate dielectric layer 102. The gate electrode 104 and the gate dielectric layer 102 are stacked on the isolation structure 108 and the device region 112 of the semiconductor substrate 106, such that gate electrode 104 overlies the gate dielectric layer 102. Further, the gate electrode 104 and the gate dielectric layer 102 overlap a pair of isolation corners 106c of the semiconductor substrate 106. The isolation corners 106c are top cross-sectional corners of the semiconductor substrate 106 that border the isolation structure 108 in the device region 112 and that adjoin the gate dielectric layer 102. Further, the isolation corners 106c are line shaped and extend laterally in parallel in a first direction, from a first end of the device region 112 to a second end of the device region 112 opposite the first end. The gate electrode 104 and the gate dielectric layer 102 have a pair of lateral recesses 118 laterally spaced between the isolation corners 106c in a second direction perpendicular to or substantially perpendicular to the first direction. The lateral recesses 118 are respectively on the first and second ends of the device region 112.

In some embodiments, the gate electrode 104 and the gate dielectric layer 102 have an H-shaped layout. Further, in some embodiments, the gate electrode 104 and the gate dielectric layer 102 have a pair of peripheral gate segments 117p and a central gate segment 117c. The peripheral and central gate segments 117p, 117c are line shaped. The peripheral gate segments 117p extend laterally in parallel in the first direction, from the first end of the device region 112 to the second end of the device region 112. Further, the peripheral gate segments 117p respectively cover the isolation corners 106c. The central gate segment 117c is between the peripheral gate segments 117p, and extends laterally in the second direction from one of the peripheral gate segments 117p to another one of the peripheral gate segments 117p.

In some embodiments, a process for patterning the conductive layer 904 and the dielectric layer 902 into the gate electrode 104 and the gate dielectric layer 102 comprises forming a patterned photoresist layer on the conductive layer 904. The patterned photoresist layer may, for example, be formed by a spin on process. The patterned photoresist layer may, for example, be patterned with a layout of the gate electrode 104 and may, for example, be patterned using photolithography. Further, in some embodiments, the process comprises performing an etch into the conductive layer 904 and the dielectric layer 902 with the patterned photoresist layer in place, and subsequently stripping the patterned photoresist layer.

As illustrated by the views 1100A-1100D of FIGS. 11A-11D, in some embodiments, a pair of LDD extensions 406 are formed in the device region 112 of the semiconductor substrate 106. The LDD extensions 406 are respectively on opposite sides of the device region 112 of the semiconductor substrate 106, and respectively underlie the lateral recesses 118 in the gate dielectric layer 102 and the gate electrode 104. Further, the LDD extensions 406 are laterally spaced from one another in a first direction, and are laterally spaced from the isolation corners 106c in a second direction transverse (e.g., perpendicular or substantially perpendicular) to the first direction. The LDD extensions 406 may, for example, be doped regions of the semiconductor substrate 106 with an opposite doping type as the well 402. In some embodiments, the LDD extensions 406 are formed by ion implantation, and/or are formed using the gate electrode 104 as a mask.

As illustrated by the views 1200A-1200D of FIGS. 12A-12D, a spacer 408 is formed on sidewalls of the gate electrode 104 and the gate dielectric layer 102. Further, in some embodiments, the spacer 408 is formed completely enclosing the gate electrode 104 and the gate dielectric layer 102. The spacer 408 may, for example, be silicon nitride, silicon dioxide, some other dielectric, or a combination of the foregoing.

In some embodiments, a process for forming the spacer 408 comprises depositing or growing a spacer layer covering and conformally lining the structure in FIGS. 11A-11D. The spacer layer may, for example, be deposited or grown by chemical or physical vapor deposition, sputtering, or some other deposition or growth process. Further, in some embodiments, the process comprises performing an etch back into the spacer layer to remove horizontal segments of the spacer layer without removing vertical segments of the spacer layer. A remaining vertical segment corresponds to the spacer 408.

As illustrated by the views 1300A-1300D of FIGS. 13A-13D, a pair of source/drain regions 114 are formed in the device region 112 of the semiconductor substrate 106. The source/drain regions 114 are formed laterally spaced from one another in a first direction, and laterally spaced from the isolation corners 106c in a second direction transverse (e.g., perpendicular or substantially perpendicular) to the first direction. Further, the source/drain regions 114 are respectively on opposite sides of the device region 112 of the semiconductor substrate 106, and respectively underlie the lateral recesses 118 in the gate dielectric layer 102 and the gate electrode 104. In some embodiments, the source/drain regions 114 respectively adjoin the LDD extensions 406. The source/drain regions 114 may, for example, be regions of the semiconductor substrate 106 with an opposite doping type as the well 402. Further, the source/drain regions 114 may, for example, have the same doping type (e.g., p-type or n-type) as the LDD extensions 406 and/or a higher doping concentration than the LDD extensions 406. In some embodiments, the source/drain regions 114 are formed by ion implantation, and/or are formed using the gate electrode 104 and the spacer 408 as a mask.

By spacing the source/drain regions 114 and the LDD extensions 406 from the isolation corners 106c, flicker noise is low. Namely, the spacing leads to high resistance from the source/drain regions 114 to the isolation corners 106c, such that a low amount of source-drain current flows through the isolation corners 106c. Further, by having the lateral recesses 118 in the gate electrode 104, the gate electrode 104 (with the spacer 408) may be employed as a mask to form the LDD extensions 406 and the source/drain regions 114 spaced from the isolation corners 106c. This, in turn, allows a low cost, low complexity process for reducing flicker noise since the same process used to pattern the gate electrode 104 may also be used to reduce flicker noise.

As illustrated by the views 1400A-1400D of FIGS. 14A-14D, in some embodiments, a pair of silicide layers 404 are respectively formed on the source/drain regions 114. Further, in some embodiments, an additional silicide layer (not shown) is formed on the gate electrode 104. The silicide layers 404 may, for example, be nickel silicide, titanium silicide, cobalt silicide, platinum silicide, tungsten silicide, or some other transition metal silicide.

In some embodiments, a process for forming the silicide layers 404 comprises depositing a transition metal layer covering the structure of FIGS. 13A-13D, and subsequently heating the transition metal layer so it reacts with exposed silicon to form the silicide layers 404. Further, in some embodiments, the process comprising removing unreacted material of the transition metal layer by an etch. The process may, for example, be a self-aligned process.

As illustrated by the views 1500A-1500D of FIGS. 15A-15D, an ILD layer 410 is formed covering the structure of FIGS. 14A-14D. The ILD layer 410 may, for example, be formed with a planar top surface, and/or may, for example, be formed of oxide, nitride, a low κ dielectric, some other dielectric, or a combination of the foregoing.

In some embodiments, a process for forming the ILD layer 410 comprises depositing or growing the ILD layer 410 covering the structure of FIGS. 14A-14D, and subsequently performing a planarization into the ILD layer 410. The depositing or growing may, for example, be formed by chemical or physical vapor deposition, sputtering, some other deposition or growth process, or a combination of the foregoing. The planarization may, for example, be performed by chemical mechanical polishing (CMP).

Also illustrated by the views 1500A-1500D of FIGS. 15A-15D, contact vias 412 are formed extending through the ILD layer 410 to the source/drain regions 114 and/or the silicide layers 404. The silicide layers 404 facilitate ohmic contacts between the contact vias 412 and the source/drain regions 114. Further, the contact vias 412 are formed extending through the ILD layer 410 to the gate electrode 104 and/or an additional silicide layer (not shown) on the gate electrode 104.

In some embodiments, a process for forming the contact vias 412 comprises performing an etch into the ILD layer 410 to form contact-via openings corresponding to the contact vias 412. The etch may be, for example, performed using photolithography. Further, in some embodiments, the process comprises filling the contact-via openings with a conductive material. The conductive-via openings may, for example, be filled by depositing or growing a conductive layer covering the ILD layer 410 and filling the contact-via openings, and subsequently performing a planarization into the ILD layer and the conductive layer. The planarization may, for example, be performed by CMP. The process may, for example, be part of a single damascene like process or a dual damascene like process.

While not shown, additional dielectric layers and conductive features may be subsequently formed stacked on the ILD layer 410. Examples of such additional dielectric layers and conductive features are shown in FIG. 6. For example, one or more additional ILD layers 604 and a passivation layer 606 in FIG. 6 may be formed stacked on the ILD layer 410, and wires 608 and inter-wire vias 610 in FIG. 6 may be formed stacked on the ILD layer 410.

Figure 16:
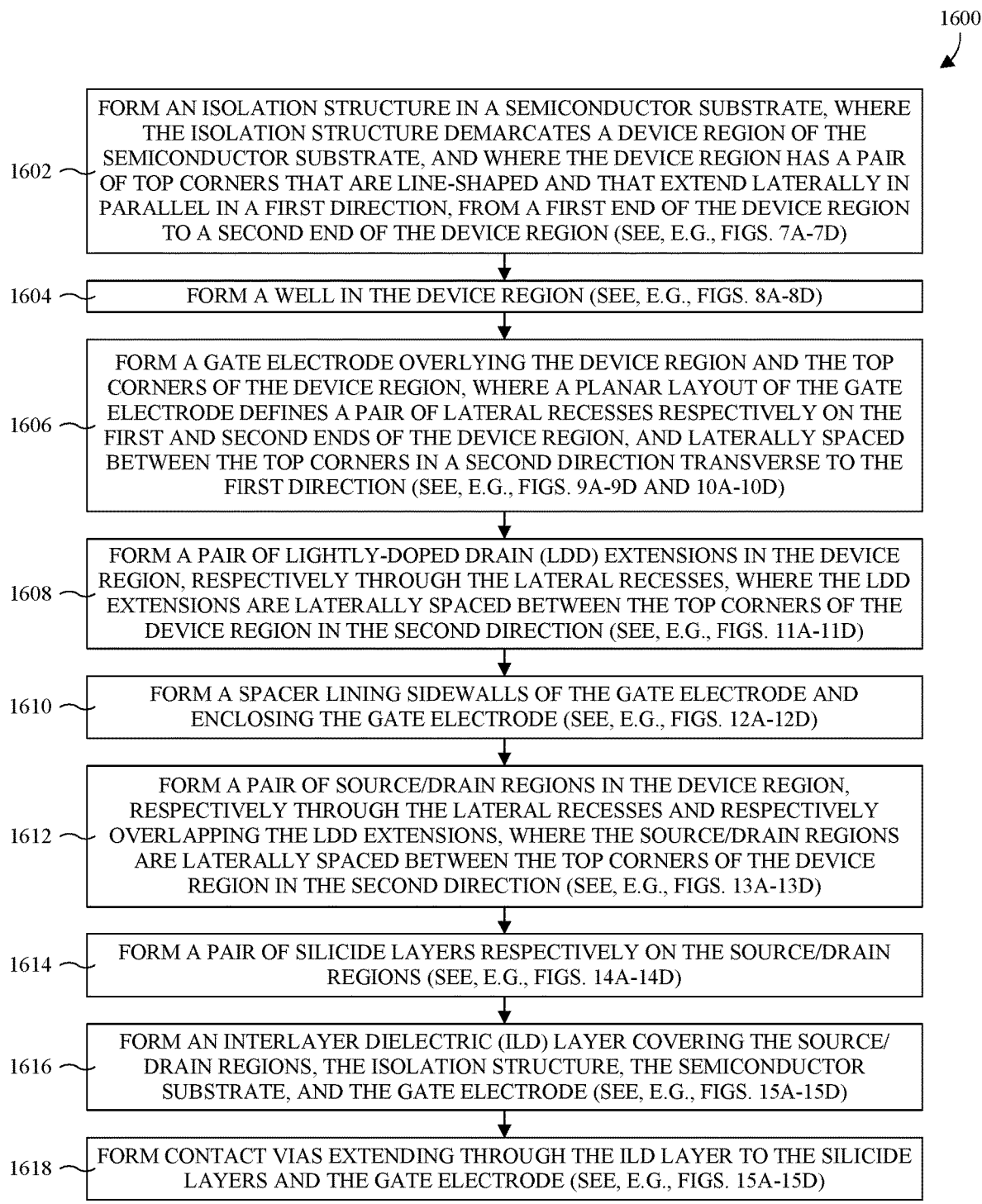
FIG. 16 illustrates a flowchart of some embodiments of the method of FIGS. 7A-7D through 15A-15D.

With reference to FIG. 16, a flowchart 1600 of some embodiments of the method of FIGS. 7A-7D through 15A-15D is provided.

At 1602, an isolation structure is formed in a semiconductor substrate. The isolation structure demarcates a device region of the semiconductor substrate. The device region has a pair of top corners that are line-shaped and that extend laterally in parallel in a first direction, from a first end of the device region to a second end of the device region. See, for example, FIGS. 7A-7D.

At 1604, in some embodiments, a well is formed in the device region. See, for example, FIGS. 8A-8D.

At 1606, a gate electrode is formed overlying the device region and the top corners of the device region, where a planar layout of the gate electrode defines a pair of lateral recesses respectively on the first and second ends of the device region, and where the lateral recesses are laterally spaced between the top corners in a second direction transverse to the first direction. See, for example, FIGS. 9A-9D and 10A-10D.

At 1608, in some embodiments, a pair of LDD extensions is formed in the device region, respectively through the lateral recesses, where the LDD extensions are laterally spaced between the top corners of the device region in the second direction See, for example, FIGS. 11A-11D.

At 1610, a spacer is formed lining sidewalls of the gate electrode and enclosing the gate electrode. See, for example, FIGS. 12A-12D.

At 1612, a pair of source/drain regions is formed in the device region, respectively through the lateral recesses and respectively overlapping the LDD extensions, where the source/drain regions are laterally spaced between the top corners of the device region in the second direction. See, for example, FIGS. 13A-13D.

At 1614, in some embodiments, a pair of silicide layers is formed respectively on the source/drain regions. See, for example, FIGS. 14A-14D.

At 1616, an ILD layer is formed covering the source/drain regions, the isolation structure, the semiconductor substrate, and the gate electrode. See, for example, FIGS. 15A-15D.

At 1618, contact vias are formed extending through the ILD layer to the silicide layers and the gate electrode. See, for example, FIGS. 15A-15D.

By spacing the source/drain regions and the LDD extensions from the top corners of the device region, flicker noise is low. Further, by having the lateral recesses in the gate electrode, the gate electrode may be employed as a mask during formation of the source/drain regions and the LDD extensions. This, in turn, allows a low cost, low complexity process for reducing flicker noise since the same patterning process used to form the gate electrode may also be used to reduce flicker noise.

While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, in some embodiments, the present application provides a semiconductor device. The semiconductor device comprises a semiconductor substrate, a pair of source/drain regions, a selectively-conductive channel, and a gate electrode. The source/drain regions are in the semiconductor substrate and are laterally spaced. The selectively-conductive channel is in the semiconductor substrate, and extends laterally in a first direction, from one of the source/drain regions to another one of the source/drain regions. The gate electrode comprises a pair of peripheral segments and a central segment. The peripheral segments extend laterally in parallel in the first direction. The central segment covers the selectively-conductive channel and extends laterally in a second direction transverse to the first direction, from one of the peripheral segments to another one of the peripheral segments.

In other embodiments, the present application provides a method for manufacturing a semiconductor device. An isolation structure is formed in a semiconductor substrate, and the isolation structure demarcates a device region of the semiconductor substrate. A gate electrode is formed overlying the device region of the semiconductor substrate. The gate electrode comprises a pair of peripheral segments and a central segment. The peripheral segments extend laterally in parallel in a first direction, and the central segment extends laterally in a second direction transverse to the first direction, from one of the peripheral segments to another one of the peripheral segments. Ion implantation is performed into the device region of the semiconductor substrate with the gate electrode in place to form a pair of source/drain regions in the device region.

In yet other embodiments, the present disclosure provides another semiconductor device. The semiconductor device comprises a semiconductor substrate, an isolation structure, a pair of source/drain regions, a selectively-conductive channel, and an H-shaped gate electrode. The isolation structure is in the semiconductor substrate, and surrounds a device region of the semiconductor substrate. The source/drain regions are in the device region of the semiconductor substrate and are laterally spaced. The selectively-conductive channel is in the device region of the semiconductor substrate, laterally between the source/drain regions. The H-shaped gate electrode covers the selectively-conductive channel without fully covering the source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate;
   a pair of source/drain regions in the semiconductor substrate, wherein the source/drain regions are laterally spaced;
   a selectively-conductive channel in the semiconductor substrate, wherein the selectively-conductive channel extends laterally in a first direction, from one of the source/drain regions to another one of the source/drain regions;
   an isolation structure extending into a top of the semiconductor substrate and demarcating a device region of the semiconductor substrate, wherein the source/drain regions and the selectively-conductive channel are in the device region, wherein the isolation structure has a pair of isolation edges extending laterally in the first direction, and wherein the isolation edges are respectively on opposite sides of the device region;
   a gate electrode comprising a pair of peripheral segments and a central segment, wherein the peripheral segments are respectively on the opposite sides of the device region and extend laterally in parallel along individual axes in the first direction, wherein the axes are disposed respectively at width-wise centers of the peripheral segments, wherein the central segment covers the selectively-conductive channel and extends laterally in a second direction transverse to the first direction, from one of the peripheral segments to another one of the peripheral segments, wherein the central segment is an only segment of the gate electrode extending from the one of the peripheral segments to the another one of the peripheral segments, and wherein the isolation edges are laterally spaced from and between the axes in the second direction; and
   multiple gate contact vias on a single one of the peripheral segments of the gate electrode, wherein the multiple gate contact vias are the only vias on the gate electrode, are spaced laterally between opposite sidewalls of the central segment, and are disposed laterally between a sidewall of the single one of the peripheral segments and a single one of the isolation edges neighboring the single one of the peripheral segments, wherein the sidewall of the single one of the peripheral segments overlies the isolation structure, and wherein the multiple gate contact vias are laterally between and laterally spaced from the axis of the single one of the peripheral segments and the sidewall of the single one of the peripheral segments.

2. The semiconductor device according to claim 1, wherein the isolation structure is a shallow trench isolation (STI) structure.

3. The semiconductor device according to claim 1, wherein the semiconductor substrate has a top cross-sectional corner that is line-shaped, that is in the device region, and that extends laterally in the first direction, from a first end of the device region to a second end of the device region opposite the first end, wherein the source/drain regions are respectively on the first and second ends of the device region, wherein the source/drain regions are laterally spaced from the top cross-sectional corner in the second direction in a planar layout of the semiconductor device, and wherein one of the peripheral segments covers the top cross-sectional corner and is laterally elongated in the first direction.

4. The semiconductor device according to claim 1, wherein the peripheral and central segments of the gate electrode are each line-shaped, and wherein the central segment is substantially perpendicular to the peripheral segments.

5. The semiconductor device according to claim 1, wherein the gate electrode has an H-shaped layout.

6. The semiconductor device according to claim 1, wherein the gate electrode defines a pair of lateral recesses on opposite sides of the gate electrode, and wherein the lateral recesses respectively outline boundaries of the source/drain regions.

7. The semiconductor device according to claim 1, further comprising:
a gate dielectric layer underlying the gate electrode, wherein the gate dielectric layer has the same layout as the gate electrode, and wherein the gate dielectric layer has sidewalls respectively aligned with sidewalls of the gate electrode.

8. The semiconductor device according to claim 1, wherein the multiple gate contact vias directly overlie the isolation structure.

9. The semiconductor device according to claim 1, further comprising:
a well region underlying the gate electrode and having an inverted T-shaped cross-sectional profile, wherein a sidewall of the well region directly underlies the single one of the peripheral segments and the isolation structure, and wherein the multiple gate contact vias are laterally between and laterally spaced from the individual axis of the single one of the peripheral segments and the sidewall of the well region.

10. A semiconductor device comprising:
a semiconductor substrate;
an isolation structure in the semiconductor substrate, wherein the isolation structure surrounds a device region of the semiconductor substrate, and wherein the isolation structure has an isolation edge extending laterally in a first direction;
a well region in the semiconductor substrate, wherein the well region has an opposite doping type as a bulk region of the semiconductor substrate and further has a well sidewall, and wherein the well sidewall neighbors the isolation edge and directly underlies the isolation structure;
a pair of source/drain regions in the device region of the semiconductor substrate, wherein the source/drain regions are laterally spaced;
a selectively-conductive channel in the device region of the semiconductor substrate, extending laterally in the first direction from one of the source/drain regions to another one of the source/drain regions;
an H-shaped gate electrode covering the selectively-conductive channel without fully covering the source/drain regions, wherein the H-shaped gate electrode has a first laterally elongated segment and a second laterally elongated segment that are laterally elongated in parallel in the first direction, and wherein the first laterally elongated segment overlies the well sidewall and has a width-wise center in a second direction transverse to the first direction;
a gate dielectric layer between the H-shaped gate electrode and the semiconductor substrate, wherein the gate dielectric layer is independent of and comprises a different material than the isolation structure; and
a plurality of gate contact vias overlying and directly contacting the H-shaped gate electrode on a single side of the H-shaped gate electrode, wherein the gate contact vias are the only vias contacting the H-shaped gate electrode and directly overlie the isolation structure, wherein a bottom surface of each gate contact via is vertically separated from the isolation structure by at least the H-shaped gate electrode and the gate dielectric layer, wherein a gate contact via of the plurality of gate contact vias is laterally between and laterally spaced from the isolation edge and the well sidewall, and wherein the gate contact via is laterally between and laterally spaced from the width-wise center and the well sidewall.

11. The semiconductor device according to claim 10, wherein the isolation structure extends laterally around the device region in a generally ring-shaped path.

12. The semiconductor device according to claim 10, wherein the H-shaped gate electrode covers the isolation edge.

13. The semiconductor device according to claim 10, wherein the plurality of gate contact vias comprise three gate contact vias that are evenly spaced in a line extending parallel to a length of the selectively-conductive channel, and wherein the three gate contact vias are even with the selectively-conductive channel.

14. The semiconductor device according to claim 13, wherein the source/drain regions overlie the well region and have an opposite doping type as the well region, and wherein the plurality of gate contact vias are laterally between and spaced from the well sidewall of the well region and a sidewall of the isolation structure.

15. A semiconductor device comprising:
a semiconductor substrate comprising a protruded section, wherein the protruded section has a pair of first opposite sidewalls and a pair of second opposite sidewalls;
an isolation structure surrounding the protruded section on the first and second opposite sidewalls of the protruded section, wherein the isolation structure comprises a pair of isolation edges, and wherein the isolation edges extend laterally in parallel with the second opposite sidewalls of the protruded section and respectively border top edges of the second opposite sidewalls;
a well in the protruded section and having an opposite doping type as an underlying and adjoining region of the semiconductor substrate;
a pair of source/drain regions overlying the well in the protruded section, wherein the source/drain regions are laterally spaced and respectively contact the first opposite sidewalls of the protruded section, and wherein the source/drain regions are laterally spaced from the second opposite sidewalls of the protruded section;
a selectively-conductive channel in the protruded section of the semiconductor substrate, laterally between the source/drain regions;
a gate electrode comprising a set of parallel segments separated by the selectively-conductive channel and the source/drain regions, wherein the parallel segments respectively extend along the second opposite sidewalls, wherein the parallel segments have end sidewalls that are even respectively with the first opposite sidewalls, wherein the parallel segments are connected by a single middle segment covering the selectively-conductive channel, wherein the parallel segments respectively have axes that are respectively disposed at individual width-wise centers of the parallel segments and that are parallel to the isolation edges, and wherein the isolation edges are laterally spaced from and between the axes; and three gate contact vias on a single one of the parallel segments of the gate electrode, wherein the three gate contact vias are the only vias on the gate electrode and are spaced laterally between opposite sidewalls of the single middle segment, wherein the three gate contact vias are evenly spaced along a line extending parallel to the isolation edges, wherein the three gate contact vias directly overlie the isolation structure and neighbor a single one of the isolation edges, and wherein the three gate contact vias are laterally offset from the single one of the isolation edges by a non-zero distance in a direction away from the selectively-conductive channel;

wherein the well has a protrusion extending laterally in the direction and terminating at a well sidewall, wherein the protrusion directly underlies the isolation structure and has a top surface directly contacting a bottom surface of the isolation structure, wherein the three gate contact vias comprise a contact via directly overlying the protrusion, wherein the single one of the parallel segments has a width-wise center in the direction, and wherein the three gate contact vias are laterally between the width-wise center and the well sidewall.

16. The semiconductor device according to claim 15, wherein the isolation structure extends laterally in a closed path to completely surround the protruded section.

17. The semiconductor device according to claim 16, wherein a cross-sectional thickness of the gate electrode is uniform from directly under a first gate contact via of the multiple gate contact vias to an opposite side of the gate electrode as the first gate contact via.

18. The semiconductor device according to claim 15, wherein the gate electrode covers the isolation edges.

19. The semiconductor device according to claim 15, further comprising:

a gate dielectric layer below the gate electrode and above the protruded section, wherein the gate dielectric layer has an H-shaped top layout.

20. The semiconductor device according to claim 15, further comprising:

a first set of source/drain region contact vias and a second set of source/drain contact vias respectively overlying the source/drain regions, and wherein the first and second sets each consist of three source/drain region contact vias that are evenly spaced along a line extending in the direction.

* * * * *